(12) United States Patent
Vora et al.

(10) Patent No.: US 7,713,804 B2
(45) Date of Patent: May 11, 2010

(54) METHOD OF FORMING AN OXIDE ISOLATED METAL SILICON-GATE JFET

(75) Inventors: Madhukar B. Vora, Los Gatos, CA (US); Ashok K. Kapoor, Palo Alto, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 12/276,574

(22) Filed: Nov. 24, 2008

(65) Prior Publication Data

US 2009/0142889 A1 Jun. 4, 2009

Related U.S. Application Data

(62) Division of application No. 11/484,402, filed on Jul. 11, 2006, now Pat. No. 7,633,101.

(51) Int. Cl.
*H01L 21/337* (2006.01)
(52) U.S. Cl. ................ 438/194; 438/196; 257/E29.312
(58) Field of Classification Search ............... 438/186, 438/194, 196; 257/E29.312
See application file for complete search history.

(56) References Cited

U.S. PATENT DOCUMENTS

| 5,618,688 | A | 4/1997 | Reuss et al. ............. 438/189 |
| 6,303,961 | B1 | 10/2001 | Shibib ..................... 257/335 |
| 6,649,462 | B2 | 11/2003 | Azuma et al. ............ 438/231 |
| 6,774,417 | B1 | 8/2004 | Lin et al. ................. 257/287 |
| 6,979,863 | B2 | 12/2005 | Ryu ......................... 257/335 |
| 7,474,125 | B2 * | 1/2009 | Kapoor ..................... 326/112 |
| 2003/0090604 | A1 | 5/2003 | Song et al. ............... 349/56 |
| 2004/0053465 | A1 | 3/2004 | Hong ........................ 438/253 |
| 2005/0151171 | A1 | 7/2005 | Hao et al. ................. 257/272 |
| 2006/0008958 | A1 | 1/2006 | Yeo et al. ................. 438/187 |
| 2007/0128787 | A1 | 6/2007 | Higashitani ............... 438/201 |

OTHER PUBLICATIONS

USPTO; *Notice of Allowance and Fee(s) Due* for U.S. Appl. No. 11/484,402, filed Jul. 11, 2006 in the name of Madhukar B. Vora, et al.; 6 pages, Aug. 5, 2009.

Adib R. Hamadé and José F. Albarrán; *A JFET/Bipolar Eight-Channel Analog Multiplexer*; IEEE Journal of Solid-State Circuits; vol. SC-10, No. 6; pp. 399-406, Dec. 1975.

Hiromitsu Takagi and Gota Kano; *Complementary JFET Negative-Resistance Devices*; IEEE Journal of Solid-State Circuits; vol. SC-10, No. 6; pp. 509-515, Dec. 1975.

Kurt Lehovec and Rainer Zuleeg; *Analysis of GaAs FET's for Integrated Logic*; IEEE Transactions on Electron Devices; vol. ED-27, No. 6; pp. 1074-1091, Jun. 1980.

(Continued)

*Primary Examiner*—Kenneth A Parker
*Assistant Examiner*—Paul A Budd
(74) *Attorney, Agent, or Firm*—Baker Botts L.L.P.

(57) ABSTRACT

A JFET structure with self-aligned metal source, drain and gate contacts with very low resistivity and very small feature sizes. Small source, drain and gate openings are etched in a thin dielectric layer which has a thickness set according to the desired source, gate and drain opening sizes, said dielectric layer having a nitride top layer. Metal is deposited on top of said dielectric layer to fill said openings and the metal is polished back to the top of the dielectric layer to achieve thin source, drain and gate contacts. Some embodiments include an anti-leakage poly-silicon layer lining the contact holes and all embodiments where spiking may occur include a barrier metal layer.

24 Claims, 12 Drawing Sheets

OTHER PUBLICATIONS

Osamu Ozawa; *Electrical Properties of a Triode-Like Silicon Vertical-Channel JFET*; IEEE Transactions on Electron Devices; vol. ED-27, No. 11; pp. 2115-2123, Nov. 1980.

R. Zuleeg; *Complementary GaAs Logic*; McDonnell Douglas Astronautics Company; 70 pages, Aug. 4, 1982.

Lis K. Nanver and Egbert J. G. Goudena; *Design Considerations for Integrated High-Frequency p-Channel JFTS's*; IEEE Transactions on Electron Devices; vol. 35, No. 11; pp. 1924-1934, Nov. 1988.

*Notification of Transmittal of the International Search Report and the Written Opinion of the International Searching Authority* for International Application No. PCT/US07/73134; 12 pages, Feb. 19, 2008.

Patent Pending U.S. Appl. No. 11/261,873 entitled *Integrated Circuit Using Complementary Junction Field Effect Transistor and MOS Transistor in Silicon and Silicon Alloys* in the name of Ashok K. Kapoor; 93 total pages, filed Oct. 28, 2005.

USPTO; *Office Action* for U.S. Appl. No. 11/484,402, filed Jul. 11, 2006 in the name of Madhukar B. Vora, et al.; 17 pages, Apr. 10, 2009.

* cited by examiner

METHOD OF FORMING AN OXIDE ISOLATED METAL SILICON-GATE JFET

RELATED APPLICATION

This application is a divisional of U.S. patent application Ser. No. 11/484,402, filed Jul. 11, 2006 and entitled "Oxide Isolated Metal Silicon-Gate JFET".

TECHNICAL FIELD OF THE INVENTION

The present disclosure relates generally to semiconductor devices and more particularly to an Oxide Isolated Metal Silicon-Gate JFET.

BACKGROUND OF THE INVENTION

The invention pertains to a device structure and method for making JFET transistors at very small line widths. The invention can overcome certain process problems caused by small line widths and related difficulties in making very thin poly-crystalline-silicon (hereafter referred to as poly-silicon) layers for device contacts.

As line widths have shrunk steadily down into the submicron range (today's line widths are 45 nanometers (NM) or 0.045 microns (where a micron is 10-6 meters and one nanometer equals 10 angstroms), all structures on CMOS, NMOS and PMOS circuits have shrunk including the thickness of the gate oxide. As line widths shrink, the voltages must be dropped to avoid punch through. This shrinking line width means the thickness of gate oxide must also be reduced so that sufficient electric field concentration to cause channel inversions in MOS devices can be achieved at the lower voltages. Shrinking gate oxide thickness causes leakage which increases power consumption in CMOS circuits and all other MOS circuits. The limit of gate oxide thickness that will not cause leakage is about 50 nanometers, which has already been reached since 45 nanometer line widths (0.045 microns) are the state of the art now.

At one micron line widths, power consumption for a one square centimeter integrated circuit was 5 watts. As line widths shrink to 45 nanometers, power consumption for the same size chip can rise to 1000 watts. This can destroy an integrated circuit which is not cooled properly, and is unacceptable for portable devices such as laptops, cell phones etc. This power consumption complicates the design process immensely because it requires circuitry to put transistors that are not working to sleep so they do not leak. Power consumption is only one of the problems caused by shrinking line widths.

Prior art junction field-effect transistors date back to the 1950's when they were first reported. Since then, they have been covered in numerous texts such as "Physics of Semiconductor Devices" by Simon Sze and "Physics and Technology of Semiconductor Devices" by Andy Grove. Junction field-effect devices were reported in both elemental and compound semiconductors. Numerous circuits with junction field-effect transistors have been reported, as follows:

1) Nanver and Goudena, "Design Considerations for Integrated High-Frequency p-Channel JFET's", IEEE Transactions on Electron Devices, Vol. 35, No. 11, 1988, pp. 1924-1934.

2) Ozawa, "Electrical Properties of a Triode-Like Silicon Vertical-Channel JFET", IEEE Transactions on Electron Devices Vol. ED-27, No. 11, 1980, pp. 2115-2123.

3) H. Takagi and G. Kano, "Complementary JFET Negative-Resistance Devices", IEEE Journal of Solid-State Circuits, Vol. SC-10, No. 6, December 1975, pp. 509-515.

4) A. Hamadé and J. Albarrán, "A JFET/Bipolar Eight-Channel Analog Multiplexer", IEEE Journal of Solid-State Circuits, Vol. SC-10, No. 6, December 1975.

5) K. Lehovec and R. Zuleeg, "Analysis of GaAs FET's for Integrated Logic", IEEE Transactions on Electron Devices, Vol. ED-27, No. 6, June 1980.

In addition, a report published by R. Zuleeg titled "Complimentary GaAs Logic" dated 4 Aug. 1982 is cited herein as prior art.

To solve this power consumption problem of MOS devices at very small line widths, the normally-off JFET has been pressed into service. A normally-off JFET is one which has been designed to be in a pinched off state when there is zero gate bias. Pinch off at zero gate bias means that with zero bias on the gate, the depletion region around the gate-channel junction extends to meet the depletion region around the channel-well or channel-substrate junction. An exemplary normally-off JFET was invented by Ashok Kapoor and described in a patent application entitled Complementary Junction Field-Effect Transistor Circuit in Silicon and Silicon Alloys, filed Oct. 28, 2005, Ser. No. 11/261,873, which is hereby incorporated by reference.

To make such devices as small as possible, it is necessary to make the active area small, and the contact holes for the source, drain and gate as narrow as the minimum line width. Small holes require thin layers of material to fill them. Poly-silicon is difficult to deposit reliably because a thin layer is needed at the small geometries which are now prevalent. In addition, a thin conductive layer is needed to form the source, drain and gate contacts, so there is a need for a device structure and methodology which can be used to make the small, thin contacts for JFETs at state of the art geometries.

SUMMARY OF THE INVENTION

The teachings of this invention contemplate use of a metal layer which has been deposited in openings in a thin dielectric layer formed over the active area and chemically-mechanically polished back to be flush with the top of said dielectric layer for formation of source and drain contacts. An opening in the thin dielectric layer over the active area and between the source and drain contact openings is also filled with metal after a gate region implant is performed into the active area to form the gate region. After polishing the metal layer back to the top of the dielectric layer, a self-aligned gate contact is formed by this process.

The advantage of the metal contact JFET structure taught herein is the lower resistivity of the source, drain and gate contacts; this lower resistivity enables greater switching speed and higher frequency response. In other JFET structures where doped poly-silicon is used for the source, drain and gate contacts, the resistivity of these contacts can be several hundred ohms per square centimeter. Metal contacts have resistivity of 0.1 ohms per square centimeter, which makes a huge difference in the top switching speed of the device.

Another significant advantage of the metal-contact JFET structure taught herein is scaling in that the source, drain and gate contacts can be made at very small, state of the art dimensions, such as 40 nanometers or less. A contact opening that small is usually also about that same thickness, i.e., about 40 nanometers. Metal can be polished down to a 40 nanometer thickness or less without problems, but poly-silicon cannot. Below about 500 angstroms, polished poly-silicon starts to get rough because of the minimum grain size of the poly.

Thus, if one tries to polish poly-silicon down to a thickness of 40 nanometers, control of the final layer thickness and quality is very poor.

BRIEF DESCRIPTION OF THE DRAWINGS

FIG. 8C is the final structure for an embodiment without a poly-silicon anti-leakage layer, as viewed along section line AA' in FIG. 9.

DETAILED DESCRIPTION OF THE INVENTION

Figure 1:
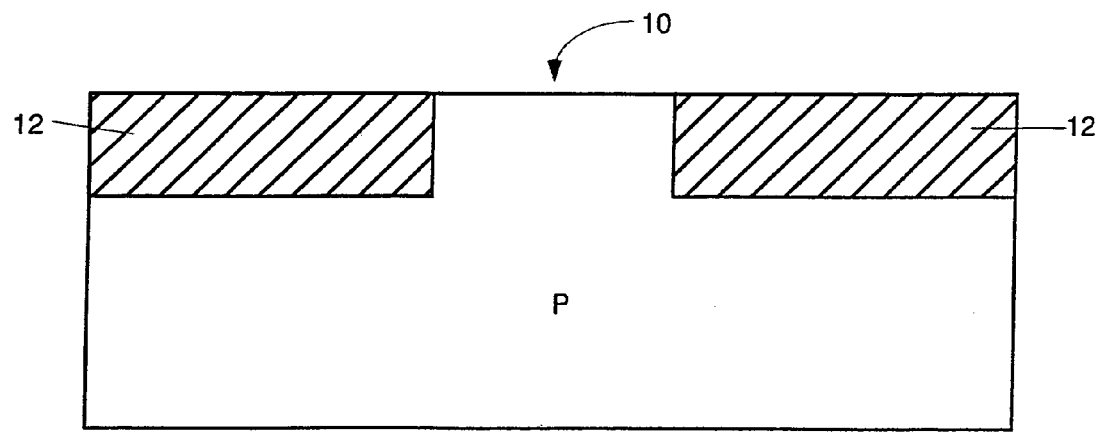
FIG. 1 is a cross-sectional diagram of the device at an early stage of construction after definition of the active area by formation of shallow trench isolation with the cross-section taken along section line A-A' in FIG. 2.

FIG. 1 is a cross-sectional diagram of the device at an early stage of construction after definition of an active area 10 by formation of field oxide areas 12 which are preferably Shallow Trench Isolation, or STI. An N-channel device will be assumed so the active area or well region 10 is doped P-type. However, a P-channel device can be built using the same process described herein by reversing the doping. This stage is reached by starting with a <100> P-type substrate, typically having a resistivity of 10 ohm-cm. In other embodiments, the semiconductor substrate is selected from the group consisting of silicon, germanium, silicon carbide, and silicon-germanium-carbon alloy. Silicon on Insulator substrates can also be used. Conventional shallow trench isolation is then performed to isolate each active area 10 where a JFET device is to be formed. No extension of the active area to a well contact is shown in the figures illustrating the process steps, but if a surface contact to a well is desired, then the active area can be formed to have two areas at the surface, one where the device is to be formed and the other where the surface contact to the well is to be formed.

Figure 2:
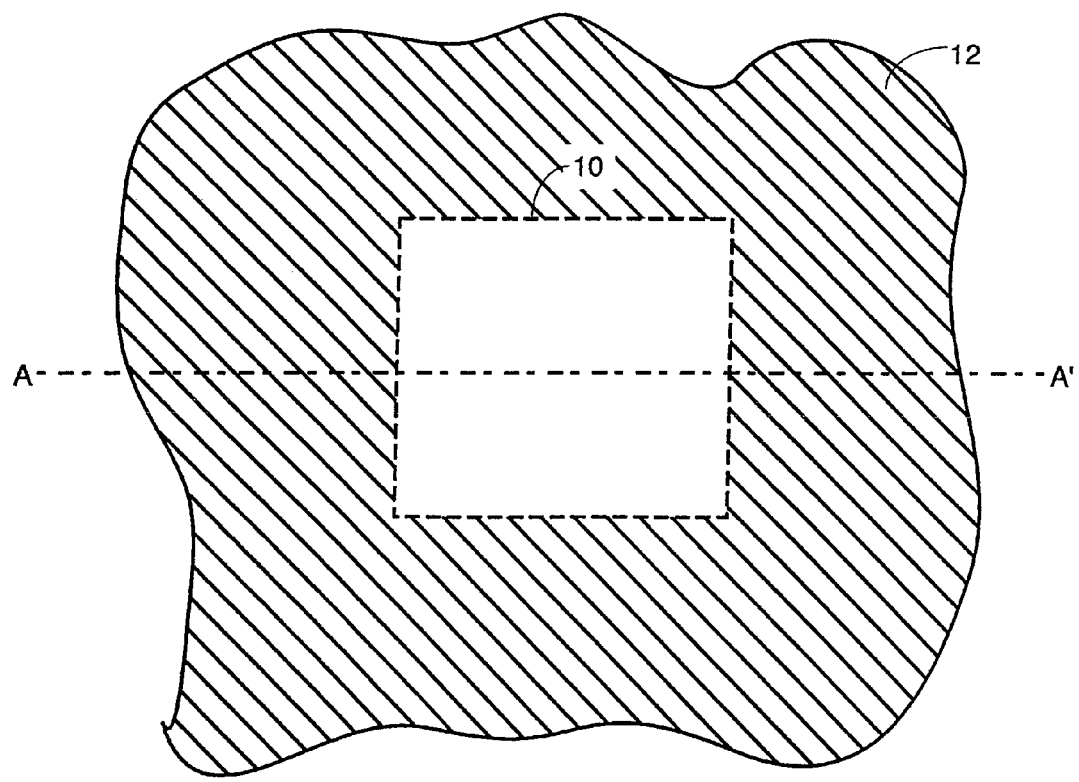
FIG. 2 is a plan view of the surface of the substrate after the field oxide STI has been formed to define active area 10.

FIG. 2 is a plan view of the surface of the substrate after the field oxide or STI has been formed to define active area 10. Further, all the process step figures show a semiconductor substrate, but those skilled in the art will understand that the substrate could also be a dielectric material having a layer of single crystal semiconductor such as silicon or silicon-germanium which has been epitaxially grown on the dielectric. The active area 10 shown in the drawings is then formed in this layer of semiconductor. The term "substrate" in the claims should be interpreted to include all these possibilities for a pure single crystal semiconductor substrate or a dielectric with a single crystal semiconductor layer formed thereon.

Figure 3:
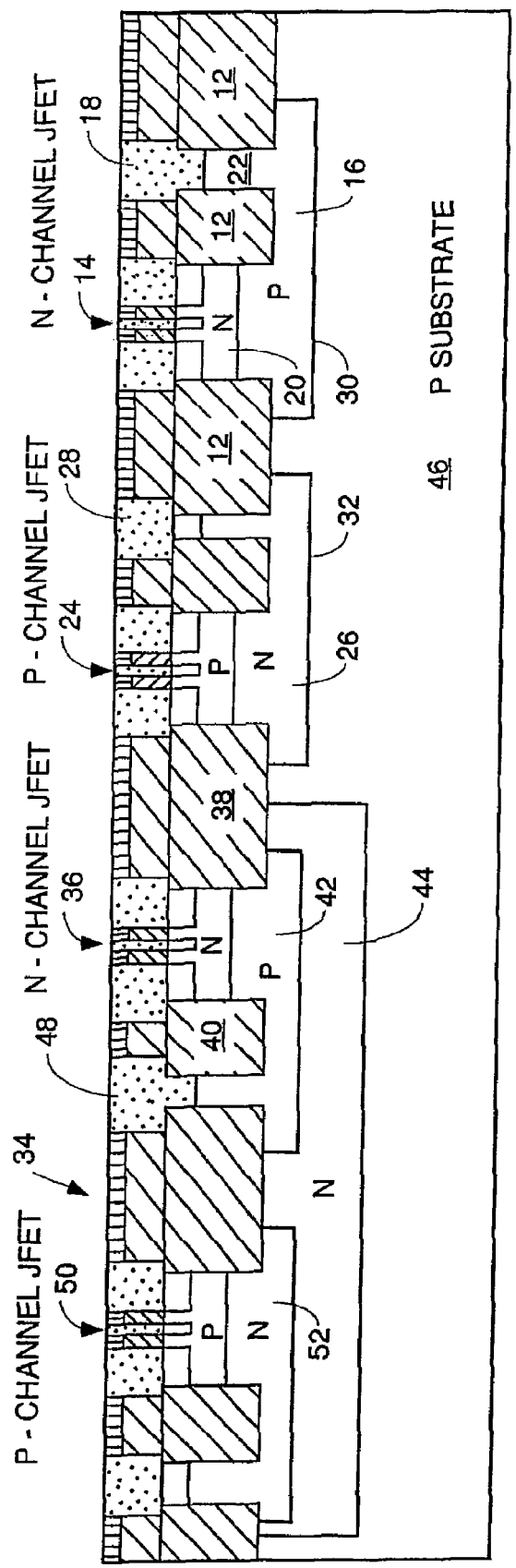
FIG. 3 is a cross-sectional view through an exemplary substrate of complementary poly-silicon contact JFETs showing how individual wells for each device with surface contacts can be formed so as to enable biasing of the back gate junctions between the well and the substrate.

FIG. 3 is a cross-sectional diagram showing how complementary JFET devices are formed using individual N-wells and P-wells and using a triple well process, each device having a surface contact. FIG. 3 shows two different well structures to isolate complementary self-aligned, normally-off, poly-silicon surface contact JFETs and is used for illustration purposes only to show the well structures and surface contacts for each JFET since the invention described herein does not use poly-silicon contacts. If metal is substituted for the poly-silicon source, drain and gate contacts, and anti-spiking barrier metal layers are added between each metal contact and the surface of the active area in FIG. 3, FIG. 3 would illustrate two different ways metal contact JFETs could be formed in the same semiconductor substrate to fabricate circuits with both P-channel and N-channel JFETs such as inverters, etc.

The first way complementary JFETs can be built in the same substrate is to put each JFET in its own well. On the right side of FIG. 3, the N-channel JFET 14 is built in P-well 16, which has surface contact 18. Field oxide 12 surrounds a first active area in which N-channel 20 is formed, and surrounds a second active area 22 to which well contact 18 makes an ohmic contact. P-channel JFET 24 is built in an N-well 26 having a surface contact 28. Surface contacts 18 and 28 can be used to reverse bias the back gates 30 and 32, respectively, to isolate the two devices.

The second way to put complementary JFET devices on the same substrate is using a triple-well process. A triple-well structure is shown generally at 34. In this structure, a self-aligned gate, normally-off N-channel JFET 36 is built in a first active area (defined by STI areas 38 and 40) in P-well 42, which is enclosed in N-well 44 formed in P-substrate 46. The P-well has a surface contact 48. A self-aligned gate, normally-off P-channel JFET 50 is built in N-well 52 which is also enclosed in N-well 44. The figures illustrating the process of construction of the device structure at issue here (specifically, FIGS. 1-2, and 4-10), do not show the surface contact to the well, but those skilled in the art understand that such a surface contact is present in most embodiments.

Figure 4:
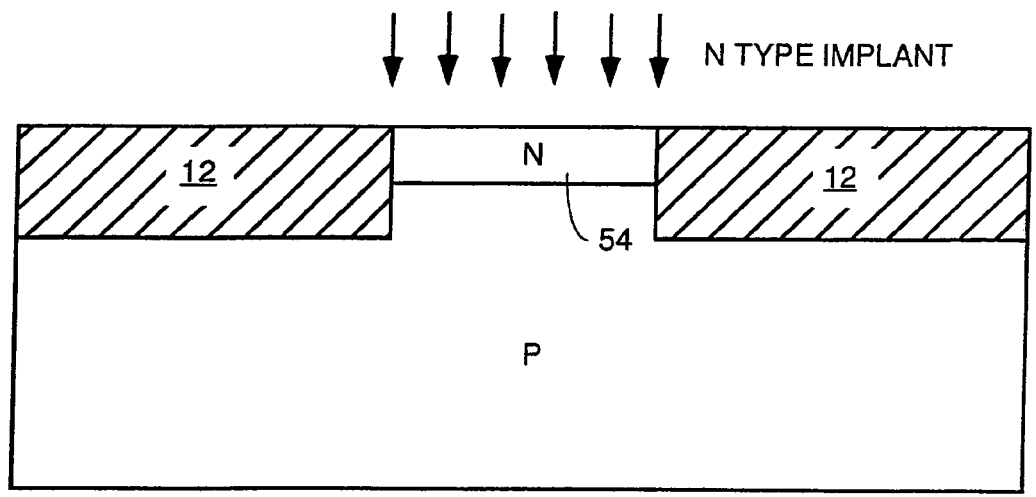
FIG. 4 is a cross-section along section line A-A' in FIG. 5 of the device after an implant is made to implant an N-channel area.
Figure 5:
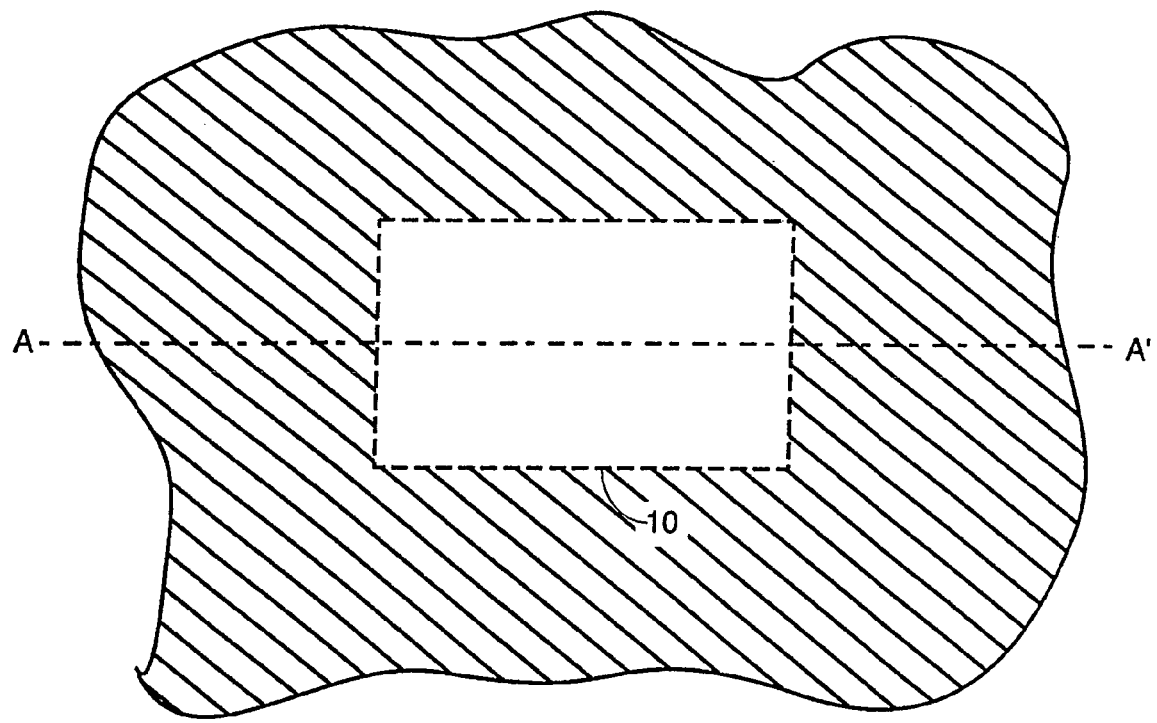
FIG. 5 is a plan view of the substrate showing active area 10 after the implant of the channel area.

FIG. 4 is a cross-section along section line A-A' in FIG. 5 of the device after an implant is made to implant an N-channel area 54. After masking to expose active area 10 (FIG. 5), an implant of N-type impurities such as phosphorous or arsenic is performed to form channel area 54. This implant can also be performed after the layer of insulating material to be described below is formed. The implant is typically done at a dosage of 1E13 at 15 KEV energy followed by a second implant at 4E11 dosage and 37 KEV energy. This gives two peaks at different depths. Low-temperature annealing to distribute the impurities more evenly can be performed immediately after the implant or later.

FIG. 5 is a plan view of the substrate showing active area 10 after the implant of the channel area.

Figure 6:
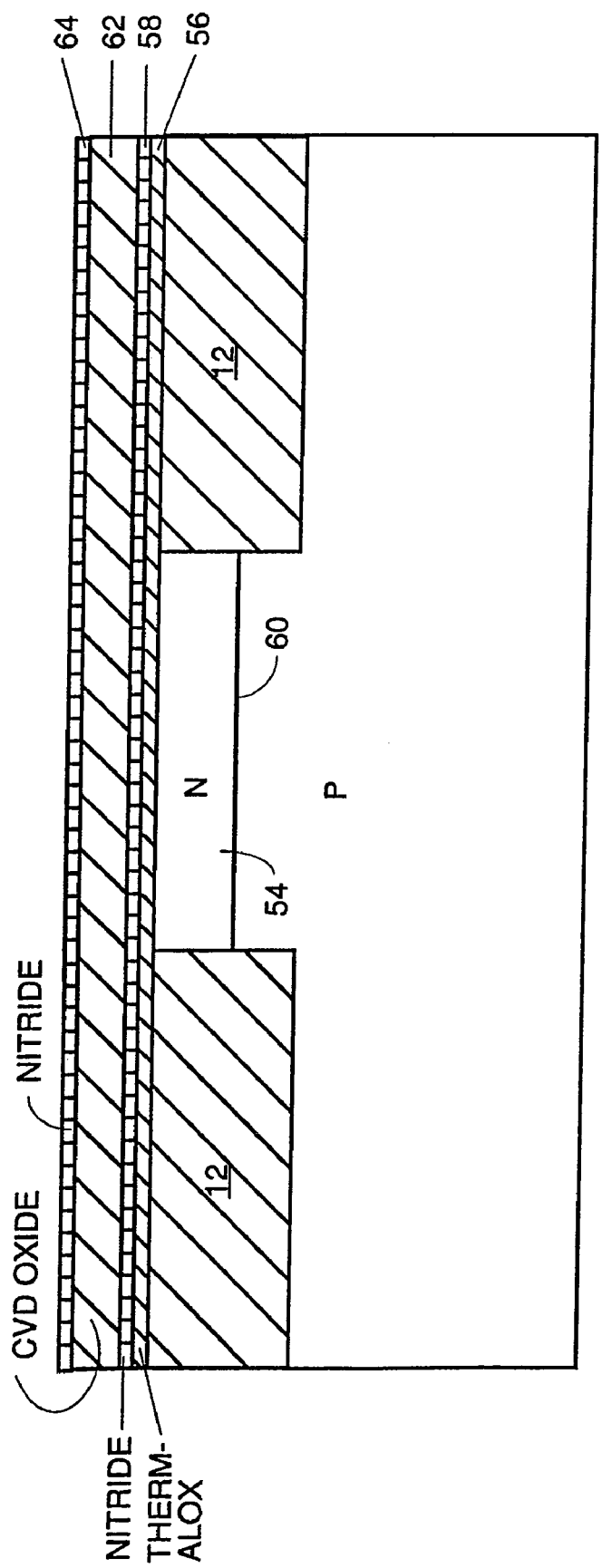
FIG. 6 is a cross-sectional view of the structure at a stage after the formation of a layer of dielectric on the top surface of the substrate.

FIG. 6 is a cross-sectional view of the structure at a stage after the formation of a layer of dielectric on the top surface of the substrate. In the preferred embodiment, a thin layer of thermal oxide 56 is grown over the exposed silicon area of the substrate. On top of this thermal oxide layer a layer of silicon nitride 58 is formed. This nitride layer 58 serves to protect the STI or field oxide outside the active area 10 from later etching when subsequent etching steps are performed to form other structures of the device. If the field oxide or STI is not protected and is accidentally etched, this etching can lead to exposure of the sidewalls of the active area and exposure of the channel-well or channel-substrate junction 60 in FIG. 6. If this junction 60 is exposed and conductive material for the gate dips down below the surface of the active area and makes electrical contact with the sidewalls of the active area, this junction 60 can be shorted, leading to undesired results and/or an inoperative device. The nitride layer 58 prevents such etching of the STI or field oxide from happening. Typically, the nitride layer is 50 angstroms thick but other thicknesses can be used.

A layer of CVD oxide 62 is formed on top of nitride layer 58. Typically, this oxide 62 is approximately 1000 angstroms thick. Finally, another layer of silicon nitride 64 is formed on top of the CVD oxide layer. The purpose of this layer is to act as a polish stop to protect the tops of source and drain contacts when excess material of a gate contact layer is removed by the chemical-mechanical-polishing (CMP) step described below.

Figure 7:
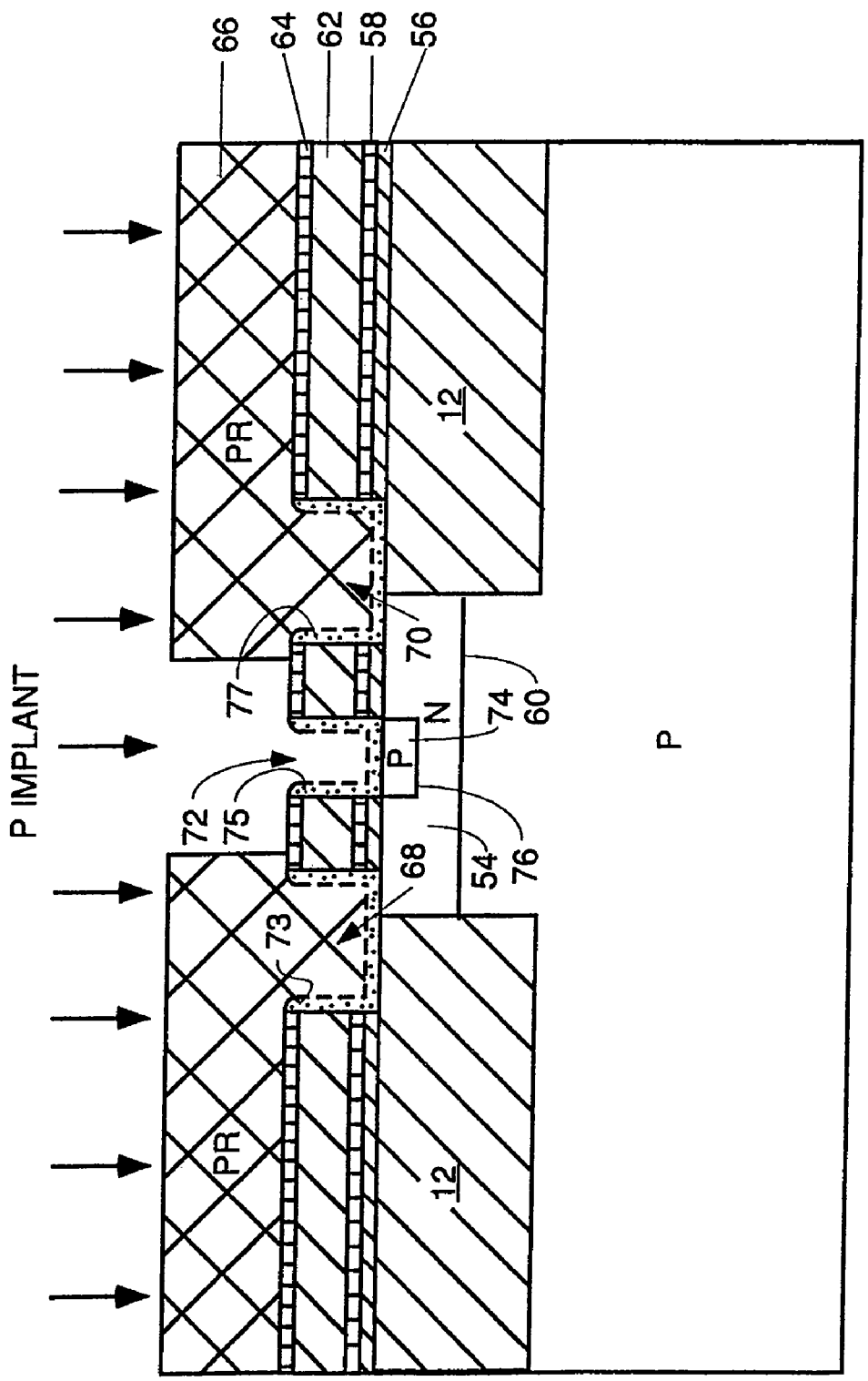
FIG. 7 is a cross-sectional view through the structure at a stage after holes for the source, drain and gate contacts have been formed and photo resist masking has been developed to allow a gate implant to be performed.

FIG. 7 is a cross-sectional view through the structure at the stage after openings for the source, drain and gate contacts have been formed and photo resist masking has been developed to allow a gate implant to be performed. The openings for the source and drain contacts at least partially overlap the active area. The opening for the gate contact lies over the active area and lies between the openings for the source and drain contacts.

In one class of embodiments, the structure is now ready for formation of the source, drain and gate regions and the source, drain and gate contacts. In another class of embodiments, the source, drain and gate openings are first lined with sputtered silicon prior to P+ and N+ implants in source, drain and gate contacts. This optional layer of sputtered silicon is represented by dashed lines 73, 75 and 77 in FIG. 7. This lining is achieved by sputtering a thin layer of poly-silicon over the entire surface of the structure after forming the source, drain and gate openings. This sputtered silicon layer is only about 50 angstroms thick. This sputtered silicon is amorphous in structure and will ultimately be doped with the type of impurities that are ion implanted or diffused through the opening into the underlying active area to form the source, drain and gate regions. This amorphous, doped silicon will act as a barrier layer between the metal contact and the underlying active area and will reduce leakage for the reasons explained below in connection with the discussion of FIGS. 12A and 12B. The thin sputtered silicon barrier layer does not affect the resistivity of the metal lines that run from the source, drain and gate contacts of each device to other parts of the integrated circuit. However, the thin sputtered silicon barrier layer does act as a resistance in series with the source, drain and gate contacts to the underlying source, drain and gate areas. But because the barrier layer is very thin, it is a small resistance.

Figures 10A, 10B:
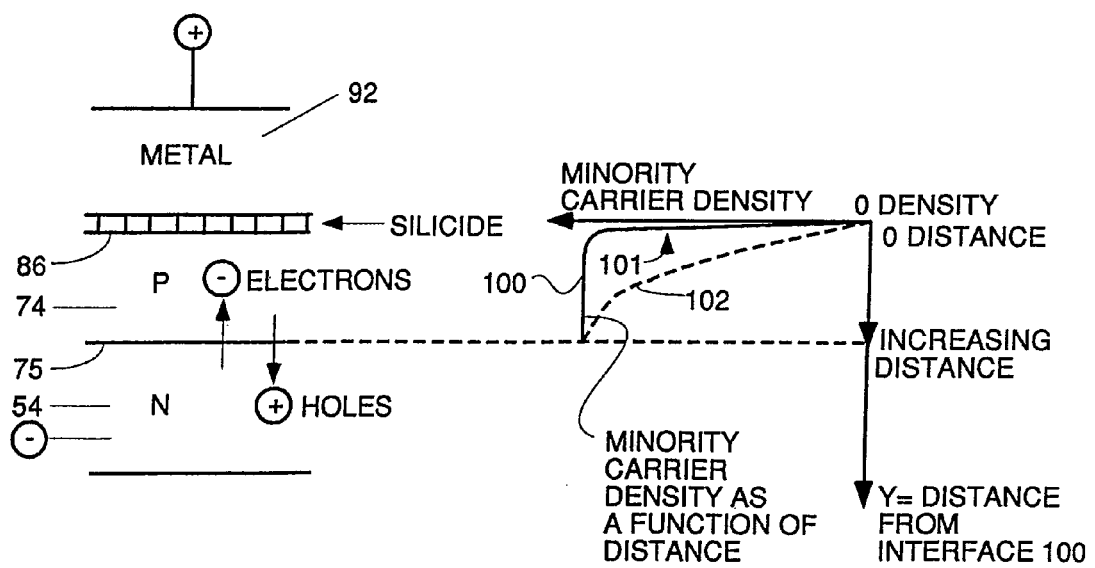
FIGS. 10A and 10B are diagrams which illustrate the leakage problem in thin junctions caused by minority carrier recombination and the solution thereto adopted in this invention.

What the thin sputtered silicon barrier layer is used for is to reduce the leakage current that is present because of the shallow gate, source and drain junctions. To understand this, the reader is referred to FIGS. 10A and 10B. Because the gate, source and drain junctions are shallow, a leakage current related to minority carrier injection and recombination occurs. This leakage current I is given by the equation: $I=C\, dN/dY$. This is a differential equation indicating the leakage current in a shallow junction situation is equal to the change in minority carrier density over distance, i.e., the slope of the minority carrier distribution curve at the interface where the leakage current is to be measured. FIG. 10A is a diagram of the physical situation of the metal gate contact 92 overlying the P-type gate region 74 overlying the N-type channel region 54. When the gate contact is biased positively relative to the channel region 54, minority carrier electrons are injected into the gate region 74. FIG. 10B is a graph of the density of these minority carriers throughout the thickness of the gate region 74 as a function of distance from the silicide ohmic gate contact 86 (the situation illustrated is without the use of the thin sputtered silicon barrier layer). The minority carrier density as a function of distance for the embodiments without the thin sputtered silicon layer is the curve 100 in FIG. 10B. At the interface 75 in FIG. 10A, the minority carrier density remains high almost near the silicide contact since not much carrier recombination is taking place. As the minority electrons approach the metal gate contact 92, much more recombination occurs because metal is an infinite sink of electrons so the density starts to fall off fast. This leads to a very steep slope $dN/dY$ in the region 101 of the gate region which leads to the existence of non trivial leakage current across interface 86.

In contrast, dashed density versus distance curve 102 in FIG. 10B represents the minority carrier density distribution versus distance for the class of embodiments wherein thin sputtered silicon barrier layer lines the source, drain and gate openings before the metal layer 80 is deposited. This amorphous silicon becomes fine grain poly silicon when wafer is annealed at high temperature to activate the implanted impurities. Since the lifetime of the minority carriers is significantly lower in poly-silicon than in single crystal silicon, the rate of recombination for minority carriers is higher in poly-silicon than in single crystal silicon. This results in a less steep slope of the $dN/dY$ curve near the contact silicide, and hence less leakage current.

After formation of the openings for the source, gate and drain contacts (and well contacts in most embodiments), it is necessary to form gate, source and drain regions. This can be done by diffusion of impurities into the active area through the openings, but is preferably done using ion implantation. Since different impurities are used for the source and drain regions than are used for the gate region, masking must be employed. As shown in FIG. 7, a layer of photo resist 66 is deposited and developed so as to cover the source opening 68 and the drain opening 70 and everything outside the gate opening 72. A P-impurity implant, typically BF2, is then performed to form gate region 74. Typically, this implant is done using two different implants, beginning with a BF2 implant at 1E15 dosage at 10-15 KEV. In some embodiments, a second implant is used, the second implant being a BF2 implant done at 2E15 dosage at approximately 36 KEV. Typical gate-channel junction depths are 5-10 nanometers in depth. The gate region could also be formed in alternative embodiments by diffusion of P-type impurities through said gate opening into the channel region.

Typically, the gate, source and drain and well contact openings are 45 NM wide but they can be as small as 20 NM wide with today's technology.

If a normally-off (enhancement mode) device is to be constructed, the doping concentration of the gate region 74 and channel region 54 and well region under the active area 10 (FIG. 5) and the junction depths of the gate-channel junction 76 and the channel-well or channel-substrate junction 60 are controlled such that pinch-off occurs at less than one volt gate bias.

In some enhancement mode device embodiments, an implant is performed to form a P+ area just below the channel 54 so as to set the concentration of impurities just below the channel to a higher level than is prevalent in the rest of the substrate. This is done in part to force the depletion layer surrounding channel-substrate junction 60 upward so that most of the depletion region is in the channel region 54 and less is in the substrate below the channel region 54. This helps insure that the depletion region around the channel-substrate junction 60 meets the depletion region around the gate-channel junction 76 so as to achieve pinch off at less than one volt gate bias for enhancement mode devices. This implant is done either before or after formation of the channel area and, preferably, before formation of the composite insulating layer on the surface of the substrate.

If a normally-on, depletion mode device is to be made, the doping concentration of the gate region 74 and channel region 54 and well region under the active area 10 and the junction depths of the gate-channel junction 76 and the channel-well or channel-substrate junction 60 are controlled such that pinch-off occurs at some desired level of gate bias higher than one volt so that the device is conducting current from source to drain at zero gate bias and some affirmative gate bias must be applied to turn it off. In the claims, the phrase "predetermined doping concentrations and junction depths" means the doping of the gate, channel and well regions and the junction depths of the gate-channel junction and the channel-well junction to achieve pinch-off at the desired gate bias. These factors will be controlled to meet whatever condition follows the phrase such as to achieve an enhancement mode device or to achieve a depletion mode device.

Figure 8A:
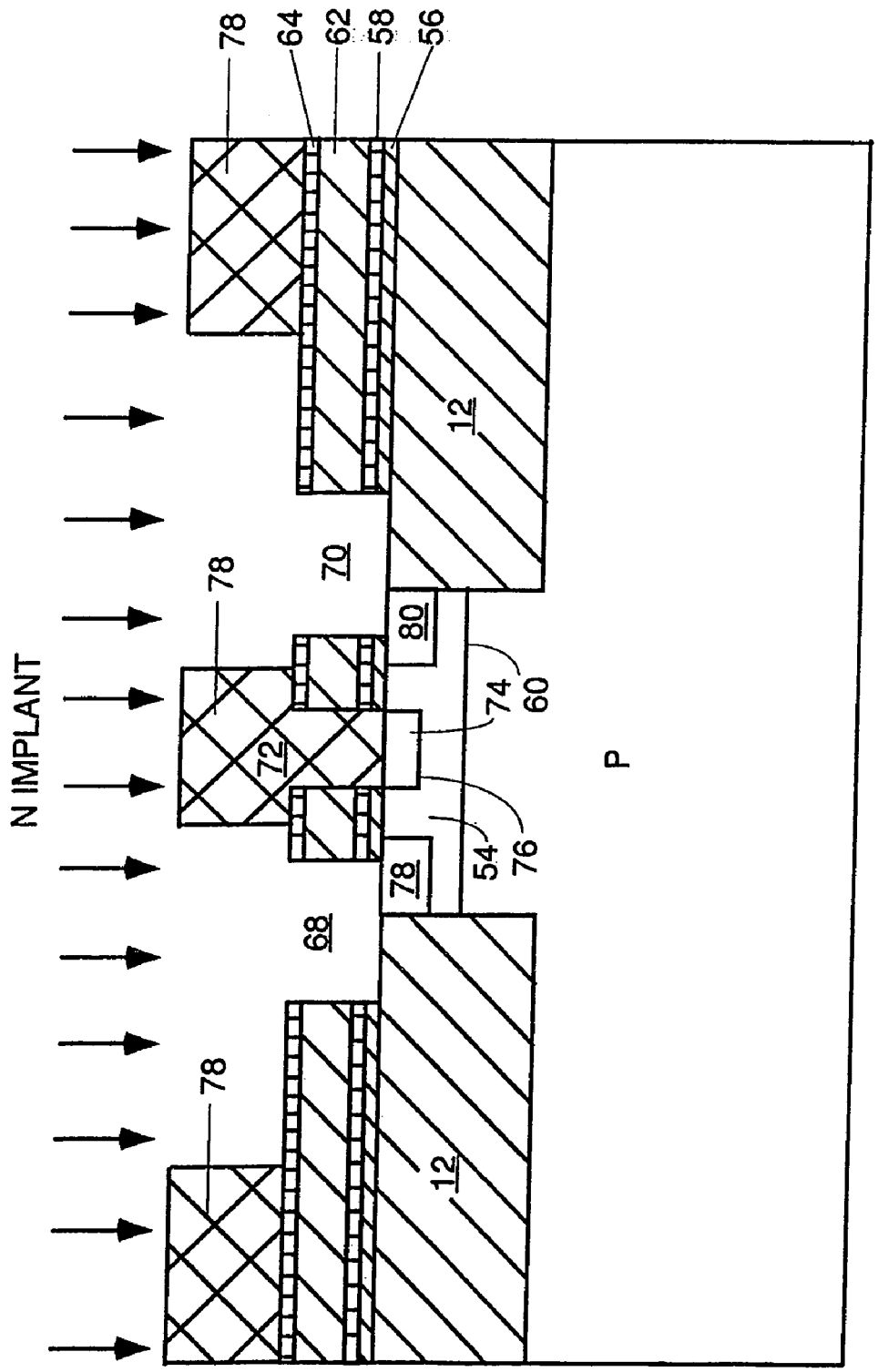
FIG. 8A shows a cross-sectional view of the structure after another masking step is performed to allow formation of source and drain regions by implantation.

FIG. 8A shows a cross-sectional view of the structure after another masking step is performed to allow formation of source and drain regions. Typically, formation of source and drain regions is done by multiple ion implantations because better control of junction depths and the shape of junctions can be achieved by ion implantation as compared to diffusion of impurities into the substrate from overlying structures. The source and drain regions could also be formed by diffusion of impurities through the source and drain holes, but this is not preferred. To reach this state of FIG. 8A, the photo resist layer 66 in FIG. 7 is removed and a new layer of photo resist 78 in Figure is deposited and developed using a mask which causes the developed photo resist to cover the gate opening and leave the source opening 68 and drain opening 70 exposed so as to expose the portion of the active area 10 beneath the source and drain openings to ion implantation. An N-type impurity implant is then performed to form source region 78 and drain region 80. Typically, these implants are performed using N-type impurities (typically arsenic or phosphorous) at 1 E15 dosage at 10-15 KEV energy level. In some embodiments, a second implant is used, the second implant being an N-type impurity implant done at 2E15 dosage at approximately 36 KEV. Typical source-channel junction and drain-channel junction depths are approximately 20-40 nanometers.

Figure 8B:
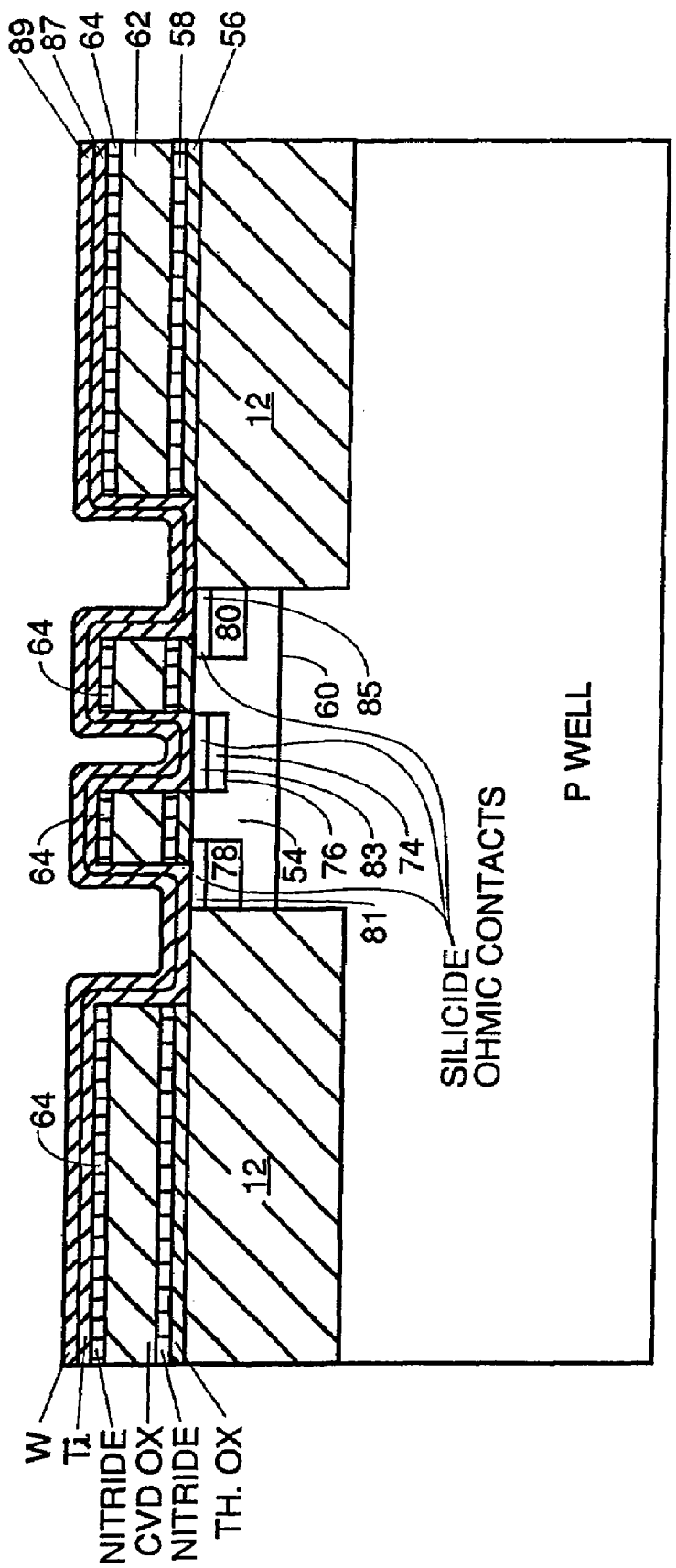
FIG. 8B shows a cross-sectional view of the structure after forming silicide ohmic contacts in each contact hole and the addition of titanium and tungsten barrier layer metal to prevent spiking.

Silicide ohmic contacts and barrier layer metal is formed next in the contact holes. There are two embodiments for this process: one without a poly-silicon anti-leakage lining of each contact hole; and one with a poly-silicon anti-leakage lining of each contact hole. FIG. 8B shows a cross-sectional view of the structure after formation of silicide ohmic contacts in each contact hole (including the back gate contact hole which is not shown) in an embodiment without the poly-silicon anti-leakage layer. To form the silicide ohmic contacts 81, 83 and 85 in FIG. 8B, all photo resist is FIG. 8A is removed and then a layer of titanium is deposited on the wafers so as to be in contact with the silicon of the active area. This layer of metal is typically 200 angstroms thick, but it can be other thicknesses. The titanium layer (not separately shown) is baked at about 600 degrees centigrade for a time sufficient to form a silicide ohmic contact of about 200 angstroms thickness at 81, 83 and 85. The titanium not converted to silicide is then dipped off in a known process.

Next, the barrier layer metal must be formed to prevent spiking of aluminum into the substrate and shorting of the shallow junctions. To do this, a layer of about 200 angstroms of titanium 87 is deposited on top of the silicide and covering the rest of the chip. This layer of titanium makes a good electrical contact to the titanium silicide ohmic contacts. There is nothing critical about the 200 angstroms thickness and other thicknesses can be used. The titanium layer only needs to be thick enough to make a good contact with the silicide. Finally, a barrier layer 89 of tungsten is deposited over the entire wafer. This tungsten layer lines the contact holes and covers the previous layer of titanium. This leaves the structure as shown in FIG. 8B.

Figure 8C:
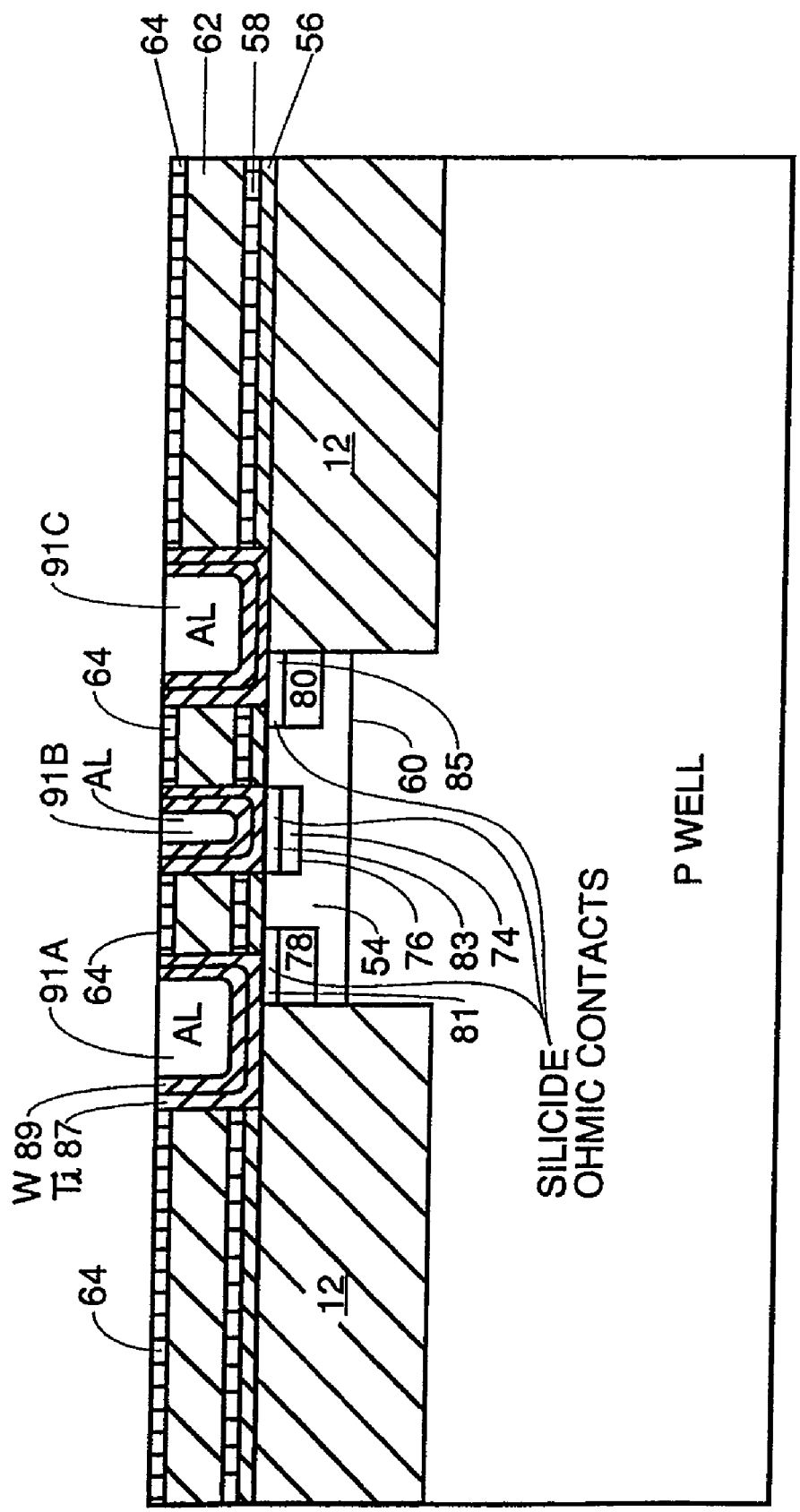
FIG. 8C is a cross-sectional view of the structure after deposition of a metal layer from which the source, drain and gate contacts will be formed and polishing back to the top of the nitride layer so as to form metal source, drain, gate and back gate contacts with silicide ohmic contacts and titanium/tungsten barrier layers.
Figure 8D:
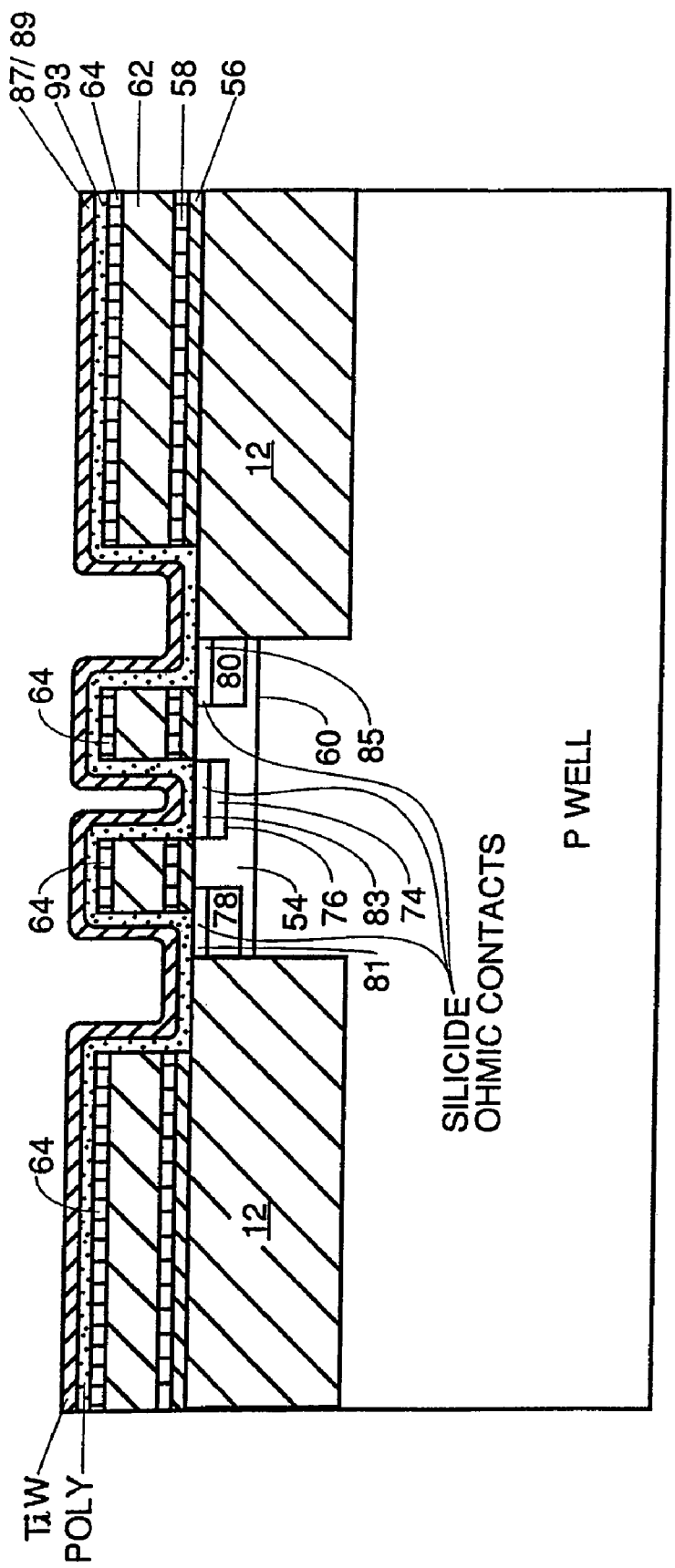
FIG. 8D is a cross-sectional view of the structure in an embodiment where a silicon anti-leakage barrier lines the contact holes taken at a stage after the poly anti-leakage barrier and TiW barrier metal layer has been formed.

FIG. 8C is a cross-sectional view of the structure after deposition of a metal layer from which the source, drain and gate contacts will be formed and polishing back to the top of the nitride layer so as to form metal source, drain, gate and back gate contacts with silicide ohmic contacts and titanium/tungsten barrier layers. FIG. 8C is the final structure for an embodiment without a poly-silicon anti-leakage layer, as viewed along section line AA' in FIG. 9. To finish this particular embodiment, an aluminum or copper metal layer 91 is deposited at a thickness usually between 1000 to 10,000 angstroms and typically from 2000 to 3000 angstroms thick. The entire layer 91 is not shown—only what remains of it as the source, drain and gate contacts after the polishing process is shown. The aluminum or copper layer 80 must be at least thick enough to at least fill the source, drain and gate openings. The aluminum or copper layer 91 covers the TiW barrier layer 87/89 and functions to prevent the aluminum or copper from spiking down into the substrate in the active area and shorting out the shallow source, drain and gate junctions to the channel region. The entire multiple layer metal coating is then polished back to the top of the nitride polish stop layer 64 which is on top of the CVD oxide dielectric layer 62 in which the source, drain and gate holes were formed. This leaves separate source, drain and gate metal contacts flush with the top of the nitride 64. These metal contacts are: source contact 87A; gate contact 87B; and drain contact 87C. FIG. 8D is a cross-sectional view of the structure in an embodiment where a poly-silicon anti-leakage barrier lines the contact holes taken at a stage after the poly anti-leakage barrier and TiW barrier metal layer has been formed. In this embodiment, the steps up to and through forming the contact holes are the same. To form the anti-leakage barrier, silicon is sputtered over the whole structure to form a layer of poly-silicon 93 of less than about 100 angstroms thickness. The poly-silicon layer 93 is thin. It only needs to be thick enough to reduce the leakage by the phenomenon explained in connection with the discussion of FIGS. 10A and 10B. Next masking and implanting is performed to implant the source and drain and gate impurities through the poly-silicon layer 93 into the substrate active area beneath the source, drain and gate holes. The details of these implants (diffusion could also be used) are given in the process recipe table given below. The implants dope the poly-silicon layer 93 also (or impurities diffuse up into the poly-silicon layer 93 from the underlying source, drain and gate regions 78, 80 and 74, respectively). If implants are used to form the source, drain and gate regions, these regions will be generally self-aligned with the perimeter of the overlying contact holes through which the implants were performed.

After forming the anti-leakage poly-silicon layer and forming the source, drain and gate regions, the remaining photo resist is removed and the ohmic contacts, barrier layer and metal contacts are formed. To form the ohmic contacts a thin layer of titanium, typically about 200 angstroms thick, is deposited over the structure and the resulting structure is baked at about 600 degrees C. for a time sufficient for the titanium to react with the poly-silicon at the bottom of each contact hole to form titanium silicide. The silicide contacts are shown at 81, 83 and 85 in FIG. 8D. The remaining titanium is dipped off where it has not formed silicide. Next, another thin layer of titanium is deposited over the wafer to cover the silicide and make a good electrical contact therewith. This forms the first layer of the barrier metal layer. (The barrier metal layer is comprised of approximately 200 angstroms of titanium and approximately 500 angstroms of tungsten although other thicknesses can be used.) After depositing the titanium layer, a layer of tungsten is deposited over the titanium and it is this tungsten layer which prevents spiking of overlying aluminum or copper into the underlying active area. The tungsten layer only needs to be thick enough to prevent spiking.

Figure 8E:
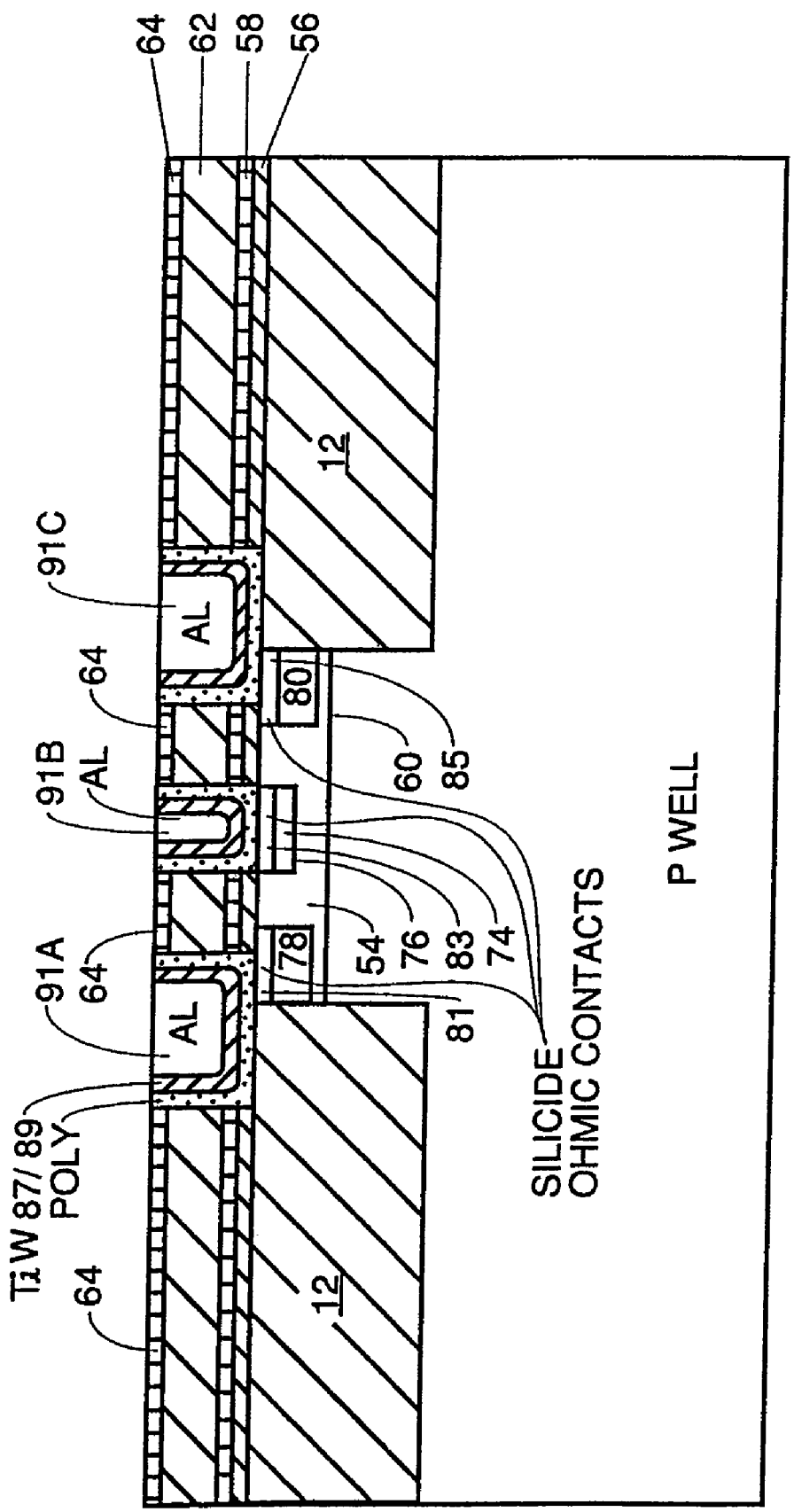
FIG. 8E is a cross-sectional view of the final structure in the embodiment where a poly-silicon anti-leakage barrier lines the contact holes. This view is taken at a stage after the poly anti-leakage barrier and TiW barrier metal layer has been formed.
Figure 9:
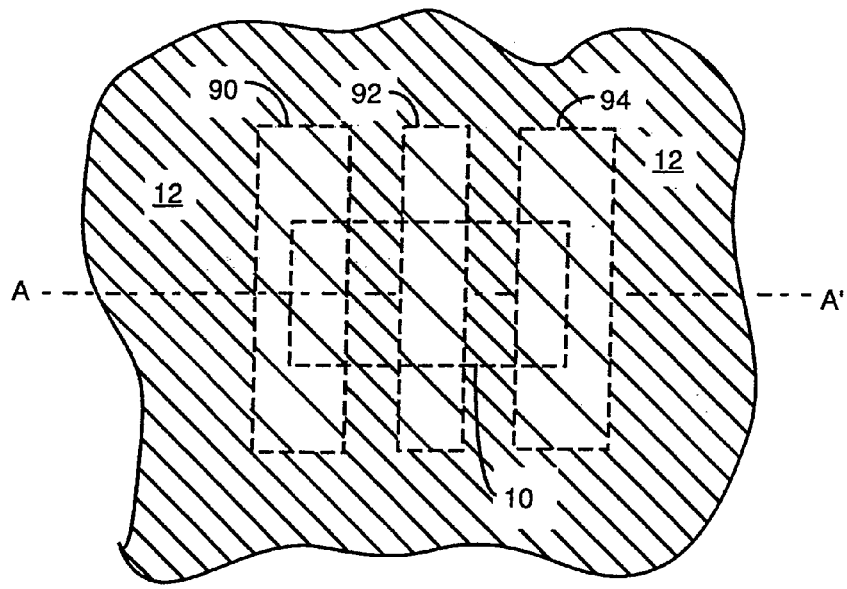
FIG. 9 is a plan view of the finished device.

FIG. 8E is a cross-sectional view of the final structure in the embodiment where a poly-silicon anti-leakage barrier lines the contact holes. To reach the stage shown in FIG. 8E, aluminum or copper (or some other metal) is deposited to fill the contact holes. Typically about 1000 to 10000 angstroms of aluminum or copper is deposited. A chemical-mechanical polishing process is then performed to polish off the metal layers of aluminum, or copper, tungsten and titanium down to the top of the nitride layer 64 on top of the dielectric layer. This polishing step forms separate metal contacts at 91A for the source, 91 B for the gate and 91 C for the drain. The polishing step also forms a separate metal contact for the back gate but this is not shown in the drawings. This completes the structure.

Figure 11:
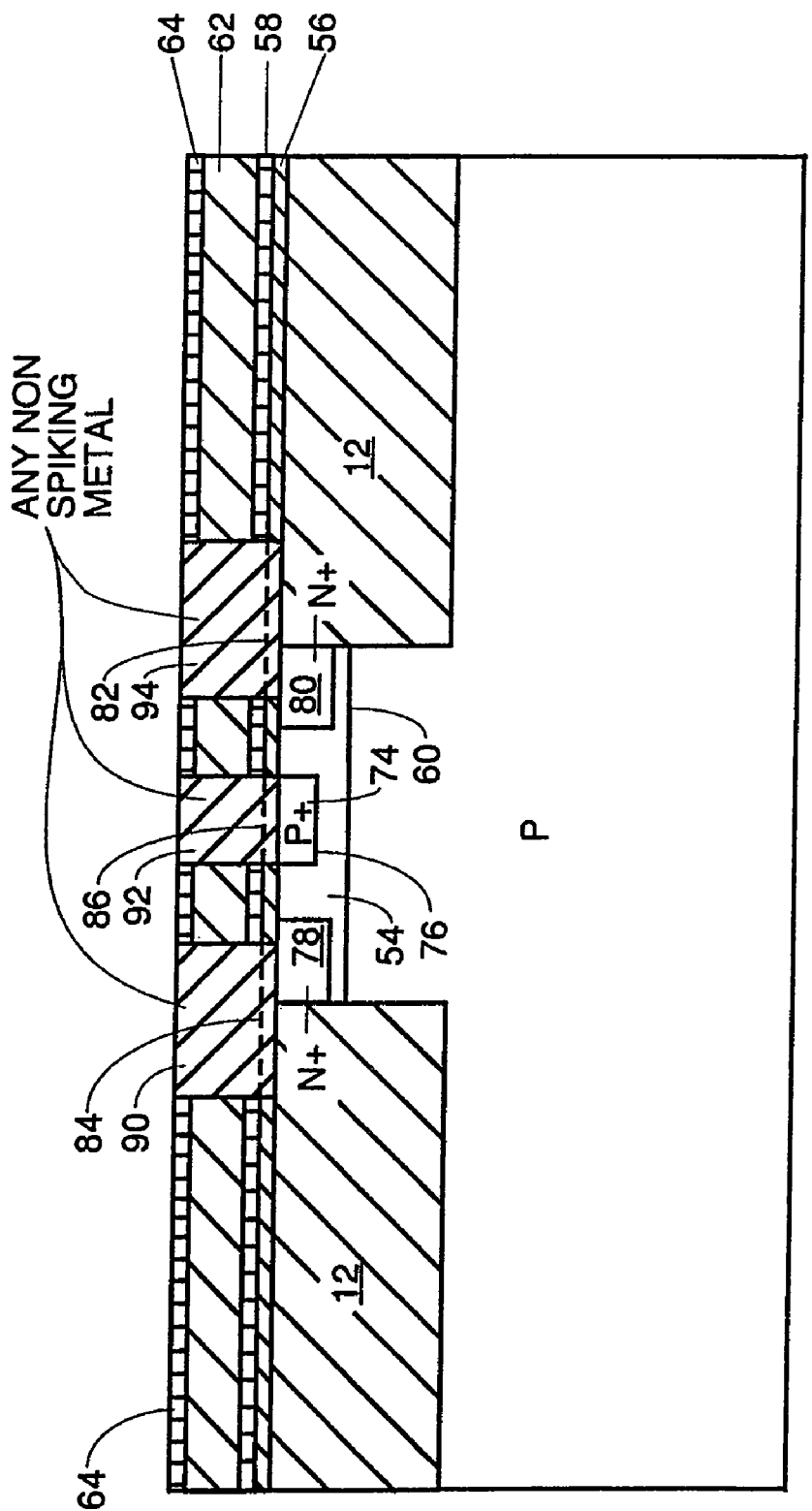
FIG. 11 represents the finished cross-sectional view of a JFET with titanium or tungsten or other non-spiking metal source, drain and gate contacts and no barrier layer.

Other metals could also be used for the metal contacts such as gold, silver, nickel, titanium or tungsten, but some of these metals have higher receptivity than copper or aluminum and would slow the switching speed of the device. If titanium or tungsten or some other metal that does not diffuse into the underlying semiconductor is used for the metal contacts, the barrier layer metal 87/89 can be omitted. FIG. 11 represents the finished cross-sectional view of a JFET with titanium or tungsten or other non spiking metal source, drain and gate contacts and interconnects and no barrier layer. In the embodiment of FIG. 11, the source and drain contacts and the self aligned gate contact and the back gate contact (not shown) are made from any non spiking metal, i.e., any metal which does not diffuse into the underlying substrate and short the underlying junctions absent the barrier layer metal. This allows elimination of the barrier metal layer 87/89 in FIGS. 8B through 8E. To improve the receptivity of the contact, if titanium is used for contacts 90, 92 and 94, a titanium silicide layer 84, 86 and 82 is formed at the bottom of each contact. This can be done by depositing a thin layer of poly-silicon in each contact hole with a thin layer of titanium on top and baking the structure at 600 degrees long enough to form silicide in the poly. Likewise, it can be done by depositing titanium over the whole structure after the contact holes are formed, baking long enough to form silicide in the substrate of the active area at the bottom of each contact hole and then polishing back the titanium to the top of the nitride. If tungsten is used for the contacts and interconnects, dashed lines 84, 86 and 82 represent a layer of titanium silicide with a layer of titanium on top of the silicide for better electrical contact. The tungsten is then deposited on top of the titanium to fill up the contact hole and form the interconnect.

The advantage of the metal contact structure taught herein is the lower resistivity of the source, drain and gate contacts; this results in the greater switching speed and higher frequency response. In other JFET structures where doped poly-silicon is used for the source, drain and gate contacts, the resistivity of these contacts can be several hundred ohms per square centimeter. Metal contacts have resistivity of 0.1 ohms per square centimeter, which makes a huge difference in the top switching speed of the device.

Another significant advantage of the metal contact JFET structure taught herein is scaling in that the source, drain and gate contacts can be made at very small, state of the art dimensions such as 40 nanometers or less. A contact opening that small is usually also about that same thickness, i.e., about 40 nanometers. Metal can be polished down to a 40 nanometer thickness or less without problems, but poly-silicon cannot. Below about 500 angstroms, polished poly-silicon starts to get rough because of the minimum grain size of the poly. If one tries to polish poly-silicon down to a thickness of 40 nanometers, control of the final layer thickness and quality is very poor.

Although the invention has been disclosed in terms of the preferred and alternative embodiments disclosed herein, those skilled in the art will appreciate that modifications and improvements may be made without departing from the scope of the invention. All such modifications are intended to be included within the scope of the claims appended hereto.

TABLE 1

The Process Recipe

| STEP NUMBER | STEP | PARAMETERS |
|---|---|---|
| 1 | Start with a <100> pure silicon substrate or germanium or silicon carbide or silicon-germanium-carbon alloy or silicon epitaxially grown on an insulating substrate | Dope semiconductor to approximately 10 ohm-centimeters resistivity |
| 2 | Option #1: form N-well and P-well if complementary N-channel and P-channel JFETs are to be formed and connected together by surface conductive paths. | Conventional masking and diffusion or ion implantation |

TABLE 1-continued

The Process Recipe

| STEP NUMBER | STEP | PARAMETERS |
|---|---|---|
|  | Option #2: form N-well and P-well each encapsulated in a third N-well if complementary N-channel and P-channel JFETs are to be formed and connected together by surface conductive paths. |  |
| 3 | Form active area in each well using Shallow Trench Isolation or any other process to electrically isolate an active area in the semiconductor, preferably with a surface contact to allow bias to be applied to the well. If complementary JFETS are to be formed, wells are not optional and must have surface contacts | Conventional thermal oxide in STI preferred. Thickness approximately 2000 angstroms (A, i.e., 200 NM) |
| 4 | Mask and perform a channel implant using ion implantation of conductivity enhancing impurities of the proper type for the type of device being constructed -- N-type for N-channel device. Anneal now or later. | Preferably use multiple implants at different energies and dosages to achieve greater uniformity in dopant distribution, e.g., 1E13 at 15 KEV followed by 4E11 at 37 KEV |
| 5 | Form a dielectric layer over the entire surface | Preferably approximately 50 angstroms (A) of thermal oxide covered by approximately 100 A silicon nitride. Cover the nitride with approximately 1000 A of CVD oxide and cover the CVD oxide with another approx 100 A nitride |
| 6 | Mask and etch to open source, drain and self-aligned gate openings | Conventional mask and etch. Openings should be as small as line width and design rules permit but may be larger - typically 45 NM but process can be scaled to smaller such as 20 NM because of use of metal contacts |
| 7 | Optional but preferred to lower contact leakage current: sputter silicon over whole structure to line openings with amorphous poly-silicon to form a leakage barrier | Conventional sputtering process. Less than 100 angstroms thickness needed. |
| 8 | Mask and implant or diffuse to form gate region. Anneal if use ion implantation | Preferably multiple ion implantations are used at different energies to increase uniformity of distribution of impurities, e.g., 1E14 at 10-15 KEV followed by 2E15 at 36 KEV to form gate-channel junction at 5-10 NM depth. P-type impurity such as BF2 if N-channel device to be formed. If enhancement-mode device desired, control junction depths and doping concentrations to achieve pinch off at gate bias less than one volt. If depletion mode device desired, control junction depths and doping concentrations to achieve pinch off at some gate voltage above 1 volt as desired. If implants are used, gate region is generally self-aligned with perimeter of gate contact opening. |
| 9 | Mask and implant or diffuse to form source and drain regions. Anneal if used ion implantation | Preferably multiple ion implantations are used at different energies to increase uniformity of distribution of impurities. Source and drain junction depths 5-10 NM. N-type impurity if N-channel device desired, e.g., phosphorous or arsenic 1E15 at 10-15 KEV followed by 2E15 at 36 KEV. If implants are used, source and drain regions are generally self-aligned with source and drain contact opening perimeters. |
| 10 | Optional P+ implant below channel area done either before or after channel implant | Preferably multiple ion implantations with dosage set to help achieve desired pinch off voltage and desired control of drain current |
| 11 | Form silicide ohmic contacts, and deposit metal layer over whole structure and polish back to nitride level on top of dielectric layer surrounding each of source, drain and gate holes | If aluminum or copper is used for metal source, drain and gate contacts, deposit titanium over the poly-silicon lining each contact hole and bake at 600 degrees for a time sufficient to form silicide ohmic contacts. Then deposit about 200 angstroms titanium over silicide to make good contact and then deposit about 500 A tungsten over the titanium to form spiking barrier, then deposit 1000 to 10000 A aluminum or copper to fill hole and make metal contact and polish all metal layers back to top of the nitride on top of the dielectric layer using CMP |

What is claimed is:

1. A manufacturing process, comprising:

in a semiconductor substrate, forming an active area in a semiconductor portion of a well region doped with a predetermined type of conductivity enhancing impurities, said active area defined by insulating material formed in said semiconductor portion, said active area having a first region where a junction field-effect transistor is to be formed and a second region in electrical contact with said first region where a surface contact to said well region is to be formed;

performing an ion implantation to form a channel region in said first region of said active area;

forming a dielectric layer on top of the channel region and at least a portion of the insulating material;

masking and etching the dielectric layer to open source, drain, and gate openings;

masking and forming a gate region through said gate opening;

masking and forming source and drain regions through said source and drain openings;

forming metal silicide ohmic contacts in said source, drain, and gate openings;

depositing a metal layer to fill said source, drain, and gate openings; and polishing said metal layer back to be approximately flush with a top of said dielectric layer.

2. The process of claim 1, wherein said semiconductor substrate is chosen from the group comprising pure <100> silicon or germanium or silicon carbide or a silicon-germanium-carbon alloy or silicon-on-insulator.

3. The process of claim 1, wherein:
masking and etching the dielectric layer further comprises masking and etching the dielectric layer to open a back gate opening;
forming metal silicide ohmic contacts further comprises forming a metal silicide ohmic contact in the back gate opening; and
depositing a metal layer further comprising depositing a metal layer to fill said back gate opening.

4. The process of claim 1, further comprising the step of forming a P-well wherever an N-channel JFET device active area is to be formed and forming an N-well wherever a P-channel JFET device active area is to be formed.

5. The process of claim 1, further comprising the step of forming a first N-well which is large enough to encompass the N-well and P-well of complementary N-channel and P-channel JFET devices formed adjacent each other, and forming a second N-well wherever a P-channel JFET device active area is to be formed, said second N-well being formed inside said first N-well, and forming a P-well wherever an N-channel JFET device active area is to be formed, said P-well formed inside said first N-well.

6. The process of claim 1, wherein said channel ion implantation is done in such a way as to achieve a doping concentration and junction depth depending upon whatever is the desired gate bias to achieve pinch off.

7. The process of claim 1, wherein said dielectric layer is formed by forming a first layer of thermally grown silicon dioxide on the surface of said substrate and forming a layer of silicon nitride (nitride) on top of said thermal oxide layer and forming a layer of chemical vapor deposition silicon dioxide (CVD oxide) on top of said nitride layer and forming another nitride layer on top of said CVD oxide layer.

8. The process of claim 1, further comprising the step of sputtering on a layer of amorphous silicon to cover the structure after the step of masking and etching to open source, drain and gate openings so as to line said source, drain and gate openings with amorphous silicon.

9. The process of claim 1, wherein said step of forming said gate region is done using multiple ion implantations at dosage and energy levels selected so as to achieve doping concentration and junction depths set according to a desired gate bias at which pinch off is to be achieved, and annealing.

10. The process of claim 1, wherein the step of forming source and drain regions is accomplished by using multiple ion implantations and annealing.

11. The process of claim 1, further comprising the step of performing an ion implantation to form a highly doped region beneath said channel region.

12. The process of claim 1, wherein said step of forming a metal layer comprises:
depositing a layer of titanium and baking it at a temperature which is high enough for an interval which is long enough to form a silicide ohmic contact in each of said source, drain, back gate and gate openings;
depositing a layer of titanium on top of said silicide;
depositing a layer of tungsten on top of said titanium so as to form a metal barrier layer to block diffusion of overlying interconnect or contact metal into the active area; and
depositing a layer of aluminum, copper, or any other metal over said metal barrier layer.

13. The process of claim 8, wherein said step of forming a metal layer comprises:
depositing a layer of titanium on top of said amorphous silicon lining every contact hole and baking said titanium at a temperature which is high enough for an interval which is long enough to form a silicide ohmic contact in each of said source, drain, back gate and gate openings;
depositing a layer of titanium on top of said silicide;
depositing a layer of tungsten on top of said titanium so as to form a metal barrier layer to block diffusion of overlying interconnect or contact metal into the active area; and
depositing a layer of aluminum, or copper, or any other metal over said metal barrier layer.

14. A process for manufacturing a junction field effect transistor, comprising:
doping a semiconductor material formed on a semiconductor substrate with impurities of a first conductivity type to form a well region;
implanting impurities of a second conductivity type into said well region to form a channel region;
forming a dielectric layer on a top surface of the structure;
masking and etching the dielectric layer to open source, drain, and gate openings;
masking and forming a gate region through said gate opening;
masking and forming source and drain regions through said source and drain openings;
forming metal silicide ohmic contacts in said source, drain, and gate openings;
depositing a metal layer to fill said source, drain, and gate openings; and
polishing said metal layer back to be approximately flush with a top of said dielectric layer.

15. The process of claim 14, wherein said semiconductor substrate is chosen from the group comprising pure <100> silicon or germanium or silicon carbide or a silicon-germanium-carbon alloy or silicon-on-insulator.

16. The process of claim 14, wherein:
masking and etching the dielectric layer further comprises masking and etching the dielectric layer to open a back gate opening;
forming metal silicide ohmic contacts further comprises forming a metal silicide ohmic contact in the back gate opening; and
depositing a metal layer further comprising depositing a metal layer to fill said back gate opening.

17. The process of claim 14, wherein said dielectric layer is formed by forming a first layer of thermally grown silicon dioxide on the surface of said substrate and forming a layer of silicon nitride (nitride) on top of said thermal oxide layer and forming a layer of chemical vapor deposition silicon dioxide (CVD oxide) on top of said nitride layer and forming another nitride layer on top of said CVD oxide layer.

18. The process of claim 14, further comprising sputtering on a layer of amorphous silicon to cover the structure after the step of masking and etching to open source, drain and gate openings so as to line said source, drain and gate openings with amorphous silicon.

19. The process of claim 14, wherein said step of forming said gate region is done using multiple ion implantations at dosage and energy levels selected so as to achieve doping concentration and junction depths set according to a desired gate bias at which pinch off is to be achieved, and annealing.

20. The process of claim 14, wherein the step of forming source and drain regions is accomplished by using multiple ion implantations and annealing.

21. The process of claim 14, further comprising performing an ion implantation to form a highly doped region beneath said channel region.

22. The process of claim 14, wherein said step of forming a metal layer comprises:
   depositing a layer of titanium and baking it at a temperature which is high enough for an interval which is long enough to form a silicide ohmic contact in each of said source, drain, back gate and gate openings;
   depositing a layer of titanium on top of said silicide;
   depositing a layer of tungsten on top of said titanium so as to form a metal barrier layer to block diffusion of overlying interconnect or contact metal into the active area; and
   depositing a layer of aluminum, copper, or any other metal over said metal barrier layer.

23. The process of claim 18, wherein said step of forming a metal layer comprises:
   depositing a layer of titanium on top of said amorphous silicon lining every contact hole and baking said titanium at a temperature which is high enough for an interval which is long enough to form a silicide ohmic contact in each of said source, drain, back gate and gate openings;
   depositing a layer of titanium on top of said silicide;
   depositing a layer of tungsten on top of said titanium so as to form a metal barrier layer to block diffusion of overlying interconnect or contact metal into the active area; and
   depositing a layer of aluminum, or copper, or any other metal over said metal barrier layer.

24. A process for manufacturing a junction field effect transistor, comprising:
   doping a semiconductor material formed on a semiconductor substrate with impurities of a first conductivity type to form a well region;
   implanting impurities of a second conductivity type into said well region to form a channel region;
   forming a dielectric layer on a top surface of the structure;
   masking and etching the dielectric layer to open source, drain, and gate openings;
   sputtering on a layer of amorphous silicon to cover the structure so as to line said source, drain and gate openings with amorphous silicon;
   masking and forming a gate region through said gate opening;
   forming a highly doped region beneath said channel region, the highly doped region of the first conductivity type;
   masking and forming source and drain regions through said source and drain openings;
   forming metal silicide ohmic contacts in said source, drain, and gate openings;
   depositing a metal layer to fill said source, drain, and gate openings; and
   polishing said metal layer back to be approximately flush with a top of said dielectric layer.

* * * * *